United States Patent
Tabatowski-Bush

(10) Patent No.: US 9,194,918 B2
(45) Date of Patent: Nov. 24, 2015

(54) LEAKAGE DETECTION CIRCUIT WITH INTEGRAL CIRCUIT ROBUSTNESS CHECK

(71) Applicant: FORD GLOBAL TECHNOLOGIES, LLC, Dearborn, MI (US)

(72) Inventor: Ben A. Tabatowski-Bush, South Lyon, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 230 days.

(21) Appl. No.: 14/104,243

(22) Filed: Dec. 12, 2013

(65) Prior Publication Data

US 2015/0168497 A1    Jun. 18, 2015

(51) Int. Cl.
*G01R 31/36* (2006.01)
*G01R 35/00* (2006.01)

(52) U.S. Cl.
CPC .......... *G01R 31/362* (2013.01); *G01R 31/3648* (2013.01); *G01R 31/3689* (2013.01); *G01R 35/00* (2013.01)

(58) Field of Classification Search
CPC ... G01R 31/36; G01R 31/361; G01R 31/3627
USPC .................. 324/426, 247, 433, 503, 509, 510
See application file for complete search history.

(56) References Cited

U.S. PATENT DOCUMENTS

| 7,102,356 B2 | 9/2006 | Wild |
| 7,629,794 B2 | 12/2009 | Kamata |
| 2010/0208396 A1* | 8/2010 | Lee ....................... H02H 11/005 361/42 |
| 2013/0099795 A1 | 4/2013 | Kamata et al. |
| 2014/0055031 A1* | 2/2014 | Miyamoto ......... H05B 33/0887 315/82 |

FOREIGN PATENT DOCUMENTS

| JP | 2008064522 | 3/2008 |
| JP | 2008139249 | 6/2008 |
| KR | 20120057385 | 6/2012 |

* cited by examiner

*Primary Examiner* — Edward Tso
(74) *Attorney, Agent, or Firm* — David B. Kelley; MacMillan, Sobanski & Todd, LLC

(57) ABSTRACT

An electrical leakage detection circuit detects electrical leakage of a battery in an electric vehicle. A first transistor switch coupled between a first and second resistor is actuated for coupling the first resistor and the second resistor. A second transistor switch coupled between a third and fourth resistor is actuated for electrically coupling the third and fourth resistor. A controller generates control signals for actuation of the first transistor switch and the second transistor switch. A first voltage is measured across the traction battery cell string. A second voltage is measured across the second resistor. A third voltage is measured across the third resistor. The controller detects electrical leakage by measuring the first, second, and third voltages and applying them in equations utilizing these voltages with constants of the first, second, third, and fourth resistances.

24 Claims, 1 Drawing Sheet

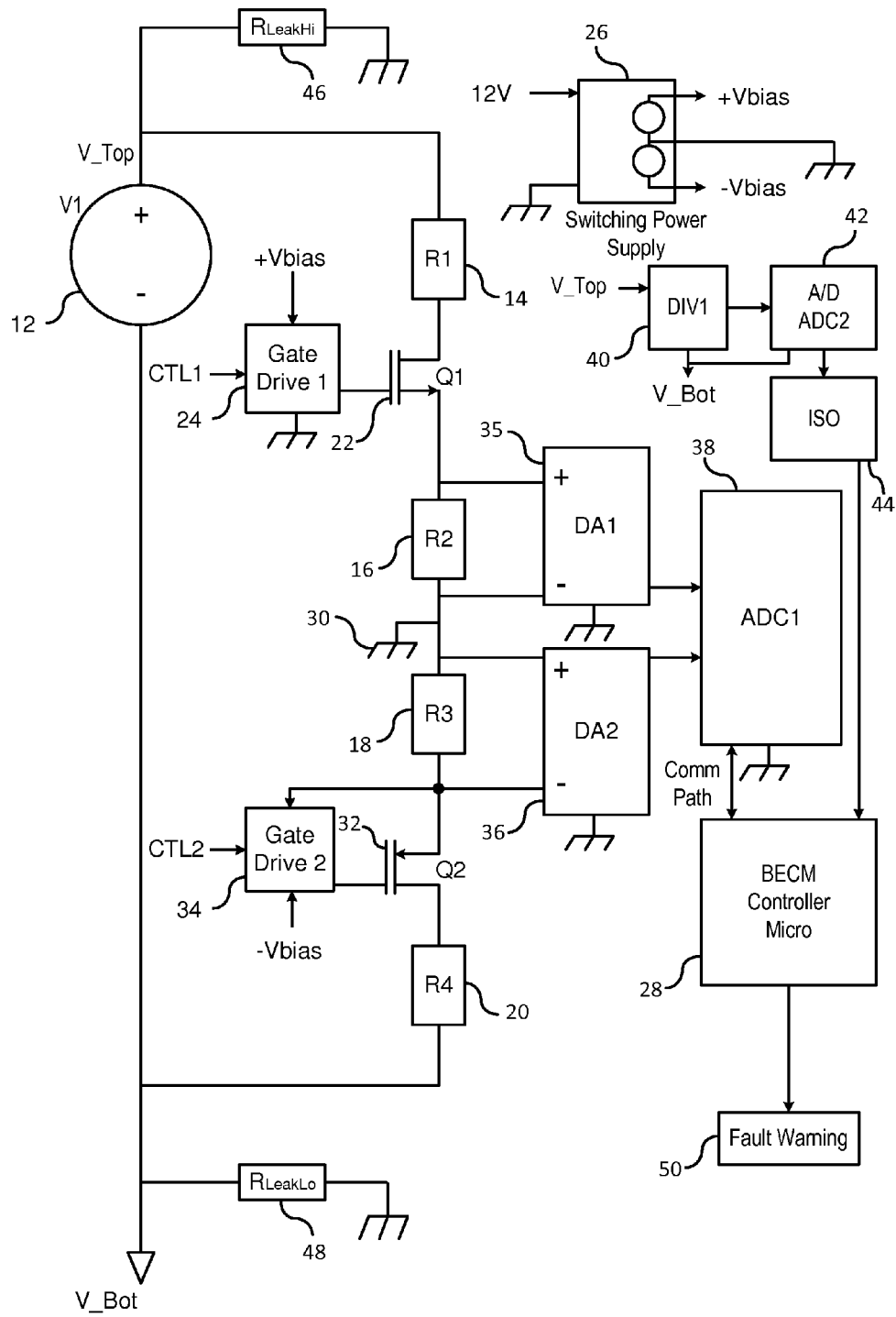

LEAKAGE DETECTION CIRCUIT WITH INTEGRAL CIRCUIT ROBUSTNESS CHECK

BACKGROUND OF INVENTION

An embodiment relates to leakage measurement for batteries.

Electric vehicles utilize use one or more electric motors or what is known as traction motors for propulsion. One form of electric vehicle includes plug-in electric vehicle (PEV) which utilizes rechargeable battery packs that can be charged from an electric grid, and the electricity stored onboard drives or contributes to drive the wheels for propulsion. The rechargeable battery packs are often connected in series for supplying a high voltage energy supply to meet the vehicle's operating requirements.

The battery voltages are monitored for identifying the battery's state-of-charge, determining an end-of-life so the battery can be replaced prior to failure, and for determining whether a short exists in the high-voltage system or whether any small leakage currents exists for identifying unknown battery drain.

Current systems that monitor electrical leakage from the battery are either complex and/or costly, using numerous switches on each battery cell within a battery cell string to identify a leakage. Therefore, a system that provides the advantages of identifying current leakage utilizing a low-cost and less complex detection circuit is needed.

SUMMARY OF INVENTION

An advantage of an embodiment is the detection of leakage current in a battery for an electric vehicle. The system includes an electrical leakage detection circuit that introduces an ohmic breach to determine how much current flows into a resistance during different circuit configurations. Resistance dividers are implemented by an actuation of switches in both a positive branch domain and negative branch domain of the circuit. A voltage equality is introduced and if the measured leakage resistance is lower than certain predetermined thresholds, then an electrical leakage is detected.

In addition a leakage test is performed during the vehicle operation to determine whether electrical leakage is occurring from the batteries during vehicle operation. This operation utilizes an ohmic resistance of the positive branch of the electric vehicle and an ohmic resistance of the negative branch of the electric vehicle.

An embodiment includes an electrical leakage detection circuit detecting electrical leaks for a plurality of batteries forming a traction battery cell string in an electric vehicle. The electric vehicle includes a high voltage domain galvanically isolated from a low voltage domain. The leakage circuit includes a plurality of resistor elements including a first resistor, a second resistor, a third resistor, and a fourth resistor coupled between a positive terminal of the traction battery cell string (the positive branch) and a negative terminal of the traction battery cell string (the negative branch). A chassis ground is coupled between the second resistor and the third resistor. A first transistor switch coupled between the first resistor and the second resistor selectively is actuated for electrically coupling the first resistor and the second resistor. A second transistor switch coupled between the third resistor and the fourth resistor is selectively actuated for electrically coupling the third resistor and the fourth resistor. A controller generates control signals for actuation of the first transistor switch and the second transistor switch. The first transistor switch and the second transistor switch are actuated to selected positions. A first voltage is measured across the traction battery cell string. A second voltage is measured across the second resistor. A third voltage is measured across the third resistor. The controller detects electrical leakage as a function of the first voltage, at least two of the resistor elements, and at least one of the second voltage and the third voltage. For the leakage test, the controller defines a first threshold voltage which corresponds to a mild leakage level, and a second threshold voltage which corresponds to a severe leakage level. These first and second thresholds are applied to the second and third voltages, and in response to these thresholds being exceeded, appropriate vehicle actions are taken.

A method for detecting electrical leakage for a plurality of batteries forming a traction battery cell string in an electric vehicle is disclosed. The electric vehicle includes a high voltage domain galvanically isolated from a low voltage domain. A leakage detection circuit detects electrical leakage from the traction battery cell string. The leakage detection circuit includes a first resistor, a second resistor, a third resistor, a fourth resistor coupled between a positive terminal of the battery cell string and the negative terminal of the battery cell string. A first transistor switch is coupled between the first resistor and the second resistor. A second transistor switch is coupled between the third resistor and the fourth resistor. The chassis ground is coupled between the second resistor and the third resistor. A controller generates control signals for actuation of the first transistor switch and the second transistor switch. The first transistor switch and the second transistor switch are actuated to selected positions. A first voltage is measured across the traction battery cell string. A second voltage is measured across the second resistor. A third voltage is measured across the third resistor. An electrical leakage is detected as a function of the first voltage, at least two of the resistor elements, and at least one of the second voltage and the third voltage. For the leakage test, the controller defines a first threshold voltage which corresponds to a mild leakage level, and a second threshold voltage which corresponds to a severe leakage level. These first and second thresholds are applied to the second and third voltages, and in response to these thresholds being exceeded, appropriate vehicle actions are taken.

Another embodiment, known as Circuit Check, includes actuating a first transistor switch coupled between a first resistor and a second resistor. A second transistor switch coupled between a third resistor and a fourth resistor is actuated. Voltages are measured across the second resistor, third resistor, and a voltage source. Circuit Check failure is detected in response to the sum of second and third resistor voltages not equal to a product of the voltage source and the constant derived by resistor values.

BRIEF DESCRIPTION OF DRAWINGS

FIG. 1 is a block diagram of a battery leakage detection circuit.

DETAILED DESCRIPTION

FIG. 1 shows a leakage detection circuit for performing circuit check and for monitoring ongoing leakage detection during operation. The leakage detection circuit may be utilized on electrified vehicles such as full hybrid electric vehicles (FHEV), plug-in electric vehicles (PEV), and a battery electric vehicle (BEV). A traction battery cell string 12 is shown generally at 12 to propel the electrified vehicle. The term traction refers to the traction battery cell string being used to provide power for propulsion of the electric vehicle.

The traction battery cell string 12 may include any number of batteries configured to one another for providing the necessary voltage for providing power to propel and operate the vehicle. The electric vehicle is split into a high voltage (HV) domain and a low voltage (LV) domain. The HV domain distributes electrical power to systems, subsystem, and components requiring voltages substantially greater than 12V, whereas the LV domain distributes power to systems, subsystems, and components requiring about 12 volts or less. It should be understood that the HV domain is required to be galvanically isolated from the LV domain.

The leakage detection circuit includes a plurality resistances coupled between a positive terminal and a negative terminal of the traction battery cell string 12. The plurality of resistances include a first resistor 14, a second resistor 16, a third resistor 18, and a fourth resistor 20.

The first resistor 14 and the second resistor 16 are selectively coupled by a first transistor switch 22. A first gate drive circuit 24 is coupled to the first transistor switch 22 for opening and closing the first transistor switch 22. The first transistor switch 22 is preferably a N-Channel MOSFET transistor; however, any transistor switch that has similar functionality and operation may be used. The first gate drive circuit 24 receives inputs from a voltage switching power supply 26 and a microcontroller 28. The first gate drive circuit 24 is coupled to chassis ground 30.

The microcontroller 28 controls actuation of the first gate drive circuit 24 and also determines leakage detection based on measurement input data which will be described in detail later.

The switching power supply 26 may be integrated as part of the leakage detection circuit or may be utilized as a separate circuit that provides functionality to other circuits or systems. The switching power supply 26 receives a 12 volt input and generates a positive bias voltage output ($+V_{bias}$) and a negative bias voltage output ($-V_{bias}$). The switching power supply has a connection to the chassis ground 30.

The third resistor 18 and the fourth resistor 20 are selectively coupled by a second transistor switch 32. A second gate drive circuit 34 is coupled to the second transistor switch 32 for opening and closing the second transistor switch 32. The second transistor switch 32 is preferably a P-Channel MOSFET; however, any transistor switch that has similar functionality and operation may be used. The second gate drive circuit 34 receives inputs from the voltage switching power supply 26 and the microcontroller 28, and is coupled to a node between the third resistor 18 and a source terminal of a p-channel MOSFET. The microcontroller 28 controls actuation of the second gate drive circuit 34 for opening and closing the second transistor switch 32.

The chassis ground 30 is also coupled between the second resistor 16 and the third resistor 18.

The leakage detection circuit further includes a first differential amplifier 35 and a second differential amplifier 36. The first differential amplifier 35 is coupled across the second resistor 16 and the second differential amplifier 36 is coupled across the third resistor 18. The first differential amplifier 35 and the second differential amplifier are both coupled to chassis ground 30. The differential amplifiers are designed to amplify the difference between two voltages measured and output a voltage representing the difference, where the output voltage is referenced to chassis ground.

The first differential amplifier 35 and the second differential amplifier 36 are each coupled to a first analog-to-digital (A/D) converter 38 that is also coupled to chassis ground 30. The A/D converter 38 converts each of the voltage inputs from the first differential amplifier 35 and second differential amplifier 36 to a digital value that is representative of the amplitude of the each respective input signals.

The microcontroller 28 is coupled to the A/D converter 38 for communicating the sensed voltage readings to the microcontroller 28 which are used to detect an electrical conductivity leakage.

The microcontroller 28 is also coupled to a voltage divider 40 through a second A/D converter 42 and a serial peripheral interface (SPI) isolator 44 for obtaining an instantaneous voltage reading of the traction battery cell string 12. Since the microcontroller is part of the LV domain, the SPI isolator provides a galvanic isolation between the HV domain and the microcontroller 28 and to allow data to be communicated between the HV domain and the microcontroller 28. The microcontroller 28 also sets the clock frequency, the clock polarity and phase with respect to the data being transmitted to the SPI isolator 44. The microcontroller 28 is further coupled to a warning output device 50 for enabling a warning that alerts the driver of the vehicle when a fault is present. The warning output device may include a visual display, audible warning, or haptic warning.

To determine whether the leakage detection circuit is operating properly, the following circuit check is performed each time the electric vehicle is started. Alternatively, the circuit check may be performed during vehicle operation. Upon startup of the vehicle, the microcontroller 28 communicates control signals to the first gate drive circuit 24 and the second gate drive circuit 34 for simultaneously actuating both the first transistor switch 22 and the second transistor switch 32 to a closed position.

The microcontroller then records the simultaneous readings of the voltages across the second resistor 16 and the third resistor 18. In addition, an instantaneous reading of the voltage of the traction battery cell string 12, hereinafter referred to as V1, is recorded by the microcontroller 28. The voltage is determined using the voltage divider 40 whereby the second A/D converter 42 reads the instantaneous voltage V1 and reports this respective voltage to the microcontroller 28 via the SPI isolator 44.

If the leakage detect circuit is operating properly, then the sum of the voltages of the second and third resistor voltage measurements will be equal to the instantaneous voltage reading V1 times a constant that is a function of a value of the resistors 14, 16, 18, 20. This is represented by the following formula:

$$V(R2)+V(R3)=K \times V1 \tag{1}$$

where V(R2) is the voltage reading of the second resistor, V(R3) is the voltage reading of the third resistor, V1 is the instantaneous voltage reading of the traction battery cell string at the time V(R2) and V(R3) are measured, and K is a resistance value constant set forth by a resistance value of each of the resistors and is represented by the following equation:

$$[R2+R3]/[R1+R2+R3+R4] \tag{2}$$

where R1 is the resistance value of the first resistor, R2 is the resistance value of the second resistor, R3 is the resistance value of the third resistor, and R4 is the resistance value of the fourth resistor.

If the determination is made that equality in equation (1) holds true (i.e., substantially equal), then the determination is made that the leakage detection circuit is operating properly. The term substantially equal relates to the difference being less than a predetermined value. Preferably, the predetermined value is 5% or less.

If the determination is made that the equality in equation (1) does not hold true (i.e., greater than 5%), then the determination is made that the leakage detection circuit has failed. In this case a warning is provided to the driver. The warning could be an output device that generates an audible signal, a visual signal, or a haptic signal. In addition, a Diagnostic Trouble Code (DTC) is stored.

After the vehicle is started and an initial circuit check is conducted, the electrical leakage circuit can perform ongoing leakage resistance testing during the operation of the vehicle. This is considered an ohmic leakage resistance test. This ohmic leakage resistance test utilizes the ohmic resistance of the electric vehicle (i.e., resistance of the circuit from the chassis ground to the positive terminal of the battery, and the resistance of the circuit from the chassis ground to the negative terminal of the battery, respectively). It is understood that the traction battery cell string 12 is galvanically isolated from the vehicle chassis. $R_{leakHi}$ 46 as shown in FIG. 1 is the resistance between the positive-most (+) terminal of the traction battery cell string 12 and the chassis ground 30, which represents an ohmic resistance to the positive branch of the high voltage (HV) side of the vehicle. The term positive-most terminal is defined herein as the last positive terminal of the traction battery cell string for which the wiring harness is coupled to for distributing power to the vehicle. $R_{leakLo}$ 48 as shown in FIG. 1 is the resistance between the negative-most (−) terminal of the traction battery cell string 12 and the chassis ground 30, which represents an ohmic resistance to the negative branch of the high voltage (HV) side of the vehicle. The term negative-most terminal is defined herein as the last negative terminal of the traction battery cell string for which the wiring harness is coupled to prior to distributing power to the vehicle. It should be understood that both $R_{leakHi}$ 46 and $R_{leakLo}$ 48 may be undesirable and may or may not exist. For example, in a typical vehicle circuit with no faults, the ohmic value may be 5 Megohms or higher for both $R_{leakHi}$ 46 and $R_{leakLo}$ 48. If there is a fault condition, then the amount of ohmic resistance, for instance, may be 200 kilohms or lower for either $R_{leakHi}$ 46 or $R_{leakLo}$ 48. When the ohmic resistance is a larger number, then it is determined that the amount of undesirable leakage is low, which represents a non-failure condition. When the ohmic resistance is a smaller number, then it is determined that more leakage is present than expected, which indicates a potential faulty condition. These undesirable resistances can be caused by faults such as pinched wires or contamination, (e.g. salt water) which creates an undesirable ohmic path from a high voltage node to the chassis ground 30. Ordinarily, just one of these undesirable resistances $R_{leakHi}$ 46 or $R_{leakLo}$ 48 would exist, corresponding to a single point failure. For both $R_{leakHi}$ 46 and $R_{leakLo}$ 48 to simultaneously measure below for instance, a measurement of 200 kilohms would constitute a double failure in Failure Mode and Effect Analysis (FMEA) terms. Although this scenario is rare, such a fault condition is possible. Therefore, equations (3) and (4), discussed are set up under the assumption of detecting a Single Point failure (i.e., one of either $R_{leakHi}$ 46 or $R_{leakLo}$ 48 measuring lower than for example 200 kilohms but not both simultaneously).

A double point failure will be discussed as follows, which means leakages $R_{leakHi}$ 46 and $R_{leakLo}$ 48 are simultaneously lower than a respective ohmic threshold (e.g., 200 kilohms). In a worst case scenario, $R_{leakHi}$ 46 and $R_{leakLo}$ 48 are substantially matching (i.e., about the same ohmic value) and are both, for example, 200 kilohms or below. This is a worst case is because this combination puts the smallest voltage for detection across the second resistor 16 (V(R2)) or third resistor 18 (V(R3)). Even for the worst case, it is still possible to notice that the measured resistance is much lower in comparison to the typical vehicle ohmic value. For example, $R_{leakHi}$ 46 would typically measure 5 Megohms in an unfaulted vehicle condition. However, if $R_{leakHi}$ 46 and $R_{leakLo}$ 48 are simultaneously 200 kilohms or below and matching, then the circuit will provide a reading of (R3+R4) ohms for $R_{leakLo}$ and (R1+R2) ohms for $R_{leakHi}$. This will not be accurate, since typical values will be for instance, 500 kohms for R1 and R4, and 5 kohms for R2 and R3. As a result, a $R_{leakHi}$ in this instance of 200 kohms would read about 500 kohms, which is incorrect. One method of handling a double fault situation as described herein is that a mild leakage threshold can be set in ohms slightly higher than (R3+R4). Therefore, a leakage would be indicated in this use case. Now, since this is a double fault which will tend to discharge the traction battery and thereby lead to the particular pack to be brought back in for replacement, it is also reasonable to set the mild leakage boundary at the 500 ohms per volt value per FMVSS305, which will be on the order of half of the (R3+R4) value.

During this test, the first transistor switch 22 is closed for a first predetermined period of time (e.g., 2 seconds) while the second transistor switch 32 remains open. The current flows from the top of V1, flows through R1, transistor switch Q1, and R2, into the chassis ground node and then through RleakLo to V_BOT. During the first predetermined period of time, the microcontroller 28 records voltage measurements for the second resistor ($VR2_{High}$) and the instantaneous voltage of the traction battery cell string ($V1_{High}$).

Thereafter, the first transistor switch 22 is opened and the second transistor switch 32 is closed for a second predetermined period of time (e.g., 2 seconds). The current starts from the top of V1, flows through $R_{leakHi}$, into the chassis ground node, and then through R3, transistor switch Q2, R4, and then to V_BOT. During the second predetermined period of time, the microcontroller 28 records voltage measurements for the second resistor ($VR3_{Low}$) and the instantaneous voltage of the traction battery cell string ($V1_{Low}$). The value of $R_{leakLo}$ can be calculated by knowing ($VR2_{High}$) and $V1_{High}$ and the resistance values of the first resistor 14 and the second resistor 16. Similarly, $R_{leakHi}$ can be calculated by knowing ($VR3_{Low}$) and $V1_{Low}$ and the value of the third resistor 18 and the fourth resistor 20.

For $R_{leakLo}$, the equality equation for determining if leakage is occurring is represented by the following formula:

$$\left[\frac{V1}{[R1 + R2 + R_{RleakLo}]}\right] \times R2 = V(R2). \tag{3}$$

where V1 is the measured instantaneous voltage of the traction battery cell string, R1 is the resistance value of the first resistor, R2 is the resistance value of the second resistor, V(R2) is the measured voltage across the second resistor, and $R_{leakLo}$ is the ohmic resistance from the negative branch to the LV domain chassis.

Given each of the known and measured parameters in eq. (3), the value of $R_{leakLo}$ can be calculated. $R_{leakLo}$ is then compared to a first predetermined threshold and a second predetermined threshold. If the value of $R_{leakLo}$ is greater that the first predetermined threshold, then a determination is made that no fault is present in the vehicle system. If the value of $R_{leakLo}$ is between the first and second predetermined thresholds, then a fault determined to be present in the vehicle system. This fault requires that driver be notified by a warning indicator or similar alerting the driver that the vehicle electrical system should be serviced in the near future. If the value of $R_{leakLo}$ is less than the second predetermined threshold, then servicing of the vehicle is required before the vehicle can be further operated. Under such circumstances, a flag may be set which prevents the vehicle from being started after the vehicle is turned off.

For $R_{leakHi}$, the equality equation for determining when leakage is occurring is represented by the following formula:

$$\left[\frac{V1}{[R3 + R4 + R_{leakHi}]}\right] \times R3 = V(R3). \quad (4)$$

where V1 is the measured instantaneous voltage of the traction battery cell string, R3 is the resistance value of the third resistor, R4 is the resistance value of the fourth resistor, V(R3) is the measured voltage across the third resistor, and $R_{leakHi}$ is the ohmic resistance from the positive branch to the LV domain.

Given each of the known and measured parameters in eq. (4), the value of $R_{leakHi}$ can be calculated. $R_{leakHi}$ is then compared to the first predetermined threshold and the second predetermined threshold. If the value of $R_{leakHi}$ is greater that the first predetermined threshold, then a determination is made that no fault is present in the vehicle system. If the value of $R_{leakHi}$ is between the first and second predetermined thresholds, then a fault determined to be present in the vehicle system. This fault requires that driver be notified by a warning indicator or similar alerting the driver that the vehicle electrical system should be serviced in the near future. If the value of $R_{leakHi}$ is less than the second predetermined threshold, then servicing of the vehicle is required before the vehicle can be further operated. Under such circumstances, a flag may be set which prevents the vehicle from being started after the vehicle is turned off.

While certain embodiments of the present invention have been described in detail, those familiar with the art to which this invention relates will recognize various alternative designs and embodiments for practicing the invention as defined by the following claims.

What is claimed is:

1. An electrical leakage detection circuit detecting electrical leaks in a traction battery cell string in an electric vehicle a high voltage domain galvanically isolated from a low voltage domain, comprising:
   first, second, third, and fourth resistors coupled between a positive terminal of the cell string and a negative terminal of the cell string;
   a chassis ground coupled between the second and third resistors;
   a first transistor switch selectively actuatable for electrically coupling the first and second resistors;
   a second transistor switch selectively actuatable for electrically coupling the third and fourth resistors; and
   a controller controlling actuation of the first and second transistor switches;
   wherein the first and second transistor switches are actuated to selected positions, a first voltage is measured across the cell string, a second voltage is measured across the second resistor, a third voltage is measured across the third resistor, the controller detects electrical leakage as a function of the first voltage, at least two of the resistors, and at least one of the second voltage and the third voltage.

2. The electrical leakage detection circuit of claim 1 wherein the first transistor switch and the second transistor switch are actuated to closed positions, wherein first voltage, the second voltage, and the third voltage are measured simultaneously, wherein the controller detects a faulty circuit operation in response to whether a sum of the first and second voltages differs from a product of the first voltage and a constant determined as a function of a first, second, third, and fourth resistor values.

3. The detection circuit of claim 2 wherein the determination for detecting the faulty circuit operation is represented by the following formula:

$$V(R2)+V(R3)=K \times V1$$

where V(R2) is the voltage reading of the second resistor, V(R3) is the voltage reading of the third resistor, V1 is the instantaneous voltage reading of the traction battery cell string at the time V(R2) and V(R3) are measured, and K is the constant set forth by a resistance value of each of the resistors.

4. The detection circuit of claim 3 wherein the constant is represented by the following equation:

$$[R2+R3]/[R1+R2+R3+R4]$$

where R1 is the resistance value of the first resistor, R2 is the resistance value of the second resistor, R3 is the resistance value of the third resistor, and R4 is the resistance value of the fourth resistor.

5. The detection circuit of claim 1 wherein the first transistor switch is actuated to a closed position and the second transistor switch is actuated simultaneously an open position during a vehicle operating condition, wherein the first voltage and the second voltage are simultaneously measured, and wherein the controller determines electrical leakage between the chassis ground and a negative-most terminal of the traction battery cell string in response to a first ohmic resistance value being less than a first predetermined threshold, wherein the first ohmic resistance value is determined as a function of the first voltage, the first resistor value, the second resistor value, and the second voltage.

6. The detection circuit of claim 5 wherein the first ohmic resistance value is determined by the following equation:

$$\left[\frac{V1}{[R1 + R2 + R_{RleakLo}]}\right] \times R2 = V(R2)$$

where V1 is the first voltage, R1 is the resistance value of the first resistor, R2 is the resistance value of the second resistor, V(R2) is the measured voltage across the second resistor, and RleakLo is the first ohmic resistance value associated with the negative branch domain of the electric vehicle.

7. The detection circuit of claim 1 wherein the first transistor switch is actuated to an open position and the second transistor switch is actuated simultaneously a closed position during a vehicle operating condition, wherein the first voltage and the second voltage is simultaneously measured, wherein the controller detects electrical leakage between the chassis ground and a positive-most terminal of the traction battery cell string in response to a second ohmic resistance value being less than a first predetermined threshold, wherein the second ohmic resistance value determined as a function of the first voltage, the third resistor value, the fourth resistor value, and the third voltage.

8. The detection circuit of claim 7 wherein the electrical leakage is represented by the following equation:

$$\left[\frac{V1}{[R3+R4+R_{RleakHi}]}\right] \times R3 = V(R3)$$

where V1 is the first voltage, R3 is the resistance value of the third resistor, R4 is the resistance value of the fourth resistor, V(R3) is the measured voltage across the third resistor, and RleakHi is the second ohmic resistance value associated with the positive branch domain of the electric vehicle.

9. The detection circuit of claim 1 further comprising a first gate drive circuit and a switching circuit, wherein the first gate drive circuit provides control signals to open and close the first transistor switch, wherein the first gate drive circuit is configured to receive a control signal from the controller and a positive bias voltage from the switching circuit.

10. The detection circuit of claim 9 further comprising a second gate drive circuit, wherein the second gate drive circuit provides control signals to open and close the second transistor switch, wherein the second gate drive circuit is configured to receive a control signal from the controller and a negative bias voltage from the switching circuit.

11. The detection circuit of claim 10 further comprising a first differential amplifier coupled across the second resistor for obtaining a first differential voltage across the second resistor, a second differential amplifier coupled across the third resistor for obtaining a second differential voltage across the third resistor, and a first analog-to-digital converter converting the first and second differential voltages to digital voltages, wherein the converted digital voltages are communicated to the controller for determining electrical leakage.

12. A method for detecting electrical leakage in a traction battery cell string in an electric vehicle having a high voltage domain galvanically isolated from a low voltage domain, comprising:
   providing a circuit including first, second, third, and fourth resistors coupled between positive and negative terminals of the cell string, a first transistor switch coupled between the first and second resistors, a second transistor switch coupled between the third and fourth resistors, a chassis ground coupled between the second and third resistors, and a controller for actuating the first and second transistor switches;
   actuating the first and second transistor switches to selected positions;
   measuring a first voltage across the cell string;
   measuring a second voltage across the second resistor;
   measuring a third voltage across the third resistor;
   detecting an electrical leakage as a function of the first voltage, at least two of the resistors, and at least one of the second and third voltages.

13. The method of claim 12 wherein the first transistor switch and the second transistor switch are actuated to closed positions, wherein first voltage, the second voltage, and the third voltage are measured simultaneously, wherein a controller detects a faulty circuit operation in response to whether a sum of the first and second voltages differs from a product of the first voltage and a constant determined as a function of a first, second, third, and fourth resistor values.

14. The method of claim 13 wherein the determination of the faulty circuit operation is represented by the following formula:

$$V(R2)+V(R3)=K \times V1$$

where V(R2) is the voltage reading of the second resistor, V(R3) is the voltage reading of the third resistor, V1 is the instantaneous voltage reading of the traction battery cell string at the time V(R2) and V(R3) are measured, and K is the constant set forth by a resistance value of each of the resistors.

15. The method of claim 14 wherein the constant is represented by the following equation:

$$[R2+R3]/[R1+R2+R3+R4]$$

where R1 is the resistance value of the first resistor, R2 is the resistance value of the second resistor, R3 is the resistance value of the third resistor, and R4 is the resistance value of the fourth resistor.

16. The method of claim 12 wherein the first transistor switch is actuated to a closed position and the second transistor switch is actuated simultaneously to an open position during a vehicle operating condition, wherein the first voltage and the second voltage are simultaneously measured, and wherein electrical leakage is determined between the chassis ground and a negative-most terminal of the traction battery cell string by the controller in response a first ohmic resistance value being less than a first predetermined threshold, wherein the first ohmic resistance value determined as a function of the first voltage, the first resistor value, the second resistor value, and the second voltage.

17. The method of claim 16 further comprising the step of actuating a warning within the vehicle in response to the determination of the first ohmic resistance value being less than a first predetermined threshold.

18. The method of claim 17 further comprising the steps of:
   determining whether the first ohmic resistance value is less than a second predetermined threshold, wherein the vehicle is disabled from starting after an ignition off operation in response to a second ohmic resistance value being less than the second predetermined threshold.

19. The method of claim 16 wherein the first ohmic resistance value is determined by the following equation:

$$\left[\frac{V1}{[R1+R2+R_{RleakLo}]}\right] \times R2 = V(R2)$$

where V1 is the first voltage, R1 is the resistance value of the first resistor, R2 is the resistance value of the second resistor, V(R2) is the measured voltage across the second resistor, and RleakLo is the first ohmic resistance value associated with the low voltage domain of the electric vehicle.

20. The method of claim 12 wherein the first transistor switch is actuated to an open position and the second transistor switch is actuated simultaneously to a closed position during a vehicle operating condition, wherein the first voltage and the third voltage are simultaneously measured, wherein the electrical leakage between the chassis ground and a positive-most terminal of the traction battery cell string is determined by the controller in response to a second ohmic resistance value being less than a first predetermined threshold, wherein the second ohmic resistance value determined as a function of the first voltage, the third resistor value, the fourth resistor value, and the third voltage.

21. The method of claim 20 further comprising the step of actuating a warning within the vehicle in response to the determination of the second ohmic resistance value being less than the first predetermined threshold.

22. The method of claim 21 further comprising the steps of:
   determining whether the second ohmic resistance value is less than a second predetermined threshold, wherein the vehicle is disabled from starting after an ignition off operation in response to the second ohmic resistance value being less than the second predetermined threshold.

23. The detection circuit of claim 20 wherein first ohmic resistance value is determined is determined by the following equation:

$$\left[\frac{V1}{[R3 + R4 + R_{RleakHi}]}\right] \times R3 = V(R3)$$

where V1 is the first voltage, R3 is the resistance value of the third resistor, R4 is the resistance value of the fourth resistor, V(R3) is the measured voltage across the third resistor, and RleakHi is the second ohmic resistance value associated with the high voltage domain of the electric vehicle.

24. A method comprising:
- actuating a first transistor switch coupled between first and second resistors;
- actuating a second transistor switch coupled between third and fourth resistors;
- measuring voltages across the second resistor, third resistor, and a voltage source;
- detecting a fault in response to the sum of second and third resistor voltages not equal to a product of the voltage source and a constant derived from resistor values.

* * * * *